United States Patent [19]

Vitek

[11] Patent Number: 4,760,917

[45] Date of Patent: Aug. 2, 1988

[54] INTEGRATED CIRCUIT CARRIER

[75] Inventor: Joseph I. Vitek, Baltimore, Md.

[73] Assignee: Westinghouse Electric Corp., Pittsburgh, Pa.

[21] Appl. No.: 934,281

[22] Filed: Nov. 24, 1986

[51] Int. Cl.⁴ .............................................. B65D 81/02
[52] U.S. Cl. ..................................... 206/331; 206/334
[58] Field of Search .......... 174/52 FP, 52 PE, 138 G; 206/328–334; 324/158 F, 158 P; 357/68, 70, 74; 361/212, 403, 406, 408; 439/71, 72, 329, 387, 526

[56] References Cited

U.S. PATENT DOCUMENTS

| | | |
|---|---|---|
| 3,405,324 | 10/1968 | Alexander et al. . |
| 3,409,861 | 11/1968 | Barnes et al. . |
| 3,417,865 | 12/1968 | Suverkropp . |
| 3,454,921 | 7/1969 | Coleman et al. . |
| 3,465,874 | 9/1969 | Hugle et al. . |
| 3,529,277 | 9/1970 | Barnes . |
| 3,604,557 | 9/1971 | Cedrone . |
| 3,652,974 | 3/1972 | Tems . |
| 3,663,920 | 5/1972 | Lapham et al. . |
| 3,723,943 | 3/1973 | Hotze . |
| 3,746,157 | 7/1973 | L'Anson . |
| 3,747,046 | 7/1973 | Watkins et al. . |
| 3,784,960 | 1/1974 | Bruckner . |
| 3,892,312 | 7/1975 | Tems . |
| 4,026,412 | 5/1977 | Henson . |
| 4,073,381 | 2/1978 | Patterson . |
| 4,176,895 | 12/1979 | Aldridge ............................ 439/71 |
| 4,295,181 | 10/1981 | Chang et al. . |
| 4,296,454 | 10/1981 | Wong . |
| 4,331,373 | 5/1982 | Demnianiuk . |
| 4,361,862 | 11/1982 | Martyniak . |
| 4,379,505 | 4/1983 | Alemanni . |
| 4,470,507 | 9/1984 | Burns . |
| 4,535,887 | 8/1985 | Egawa . |
| 4,556,145 | 12/1985 | Putnam . |
| 4,562,924 | 1/1986 | Okamoto . |
| 4,591,053 | 5/1986 | Alemanni ............................ 206/334 |

Primary Examiner—Jimmy G. Foster
Attorney, Agent, or Firm—W. G. Sutcliff

[57] ABSTRACT

An integrated circuit package carrier is disclosed which is useful to carry to variety of different sized integrated circuit packages and which is useful for a greater number of flexures. The carrier device comprises a carrier body with an opening extending through the carrier body. A pair of beams are carried by the carrier body and are disposed within the opening, with each of the beams comprising a beam body portion and a connection spring at each end of the beam body portion for connecting the beam body portion to the carrier body and for biasing the beam body portions towards each other. A beam accepting aperture is disposed longitudinally outwardly of each of the beams, and a shaped retainer extends upwardly from each of the beams and inwardly towards the other of the beams. The retainers are spaced apart at locations adjacent the beams a distance sufficient to accommodate therebetween the body of the chip to be received, while being spaced apart at their uppermost locations a distance effective to prevent passage of a chip past the retainer. The retainers by outward deflection of the beams against the bias of the connection springs into the beam accepting apertures, are shiftable to permit passage of a chip body to between the retainers and being thereafter returnable to the passage preventing position when the beams return to their spring means biased positions.

30 Claims, 4 Drawing Sheets

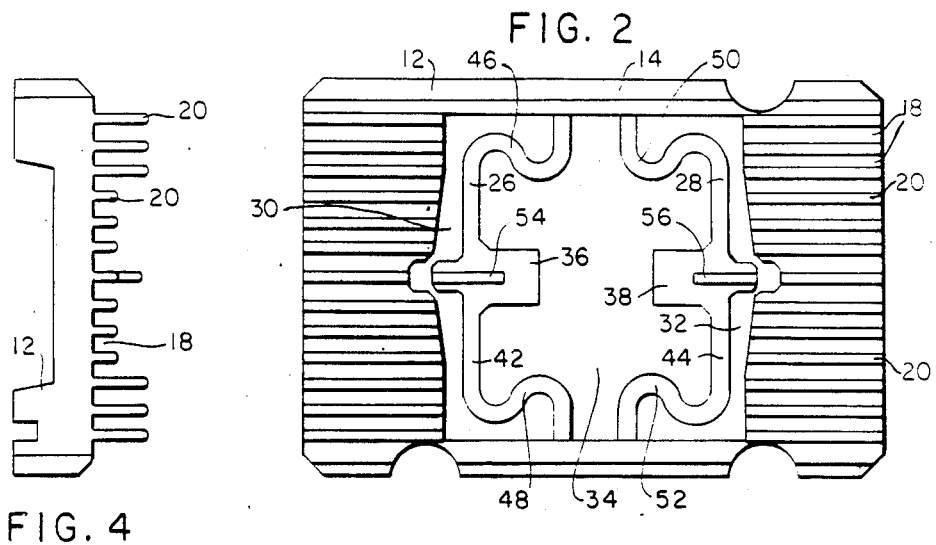
FIG. 2
FIG. 4
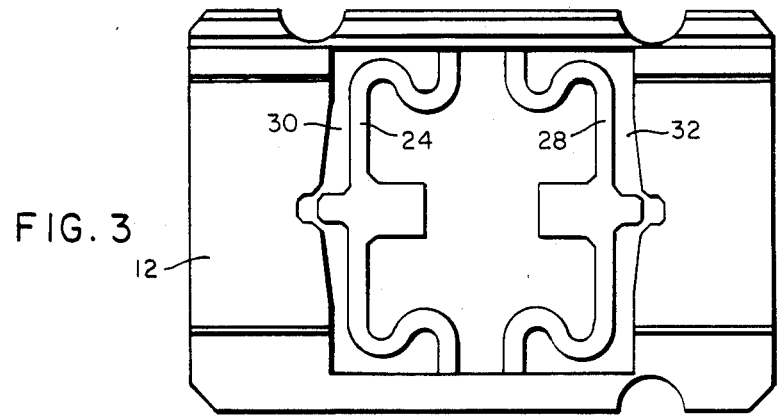
FIG. 3
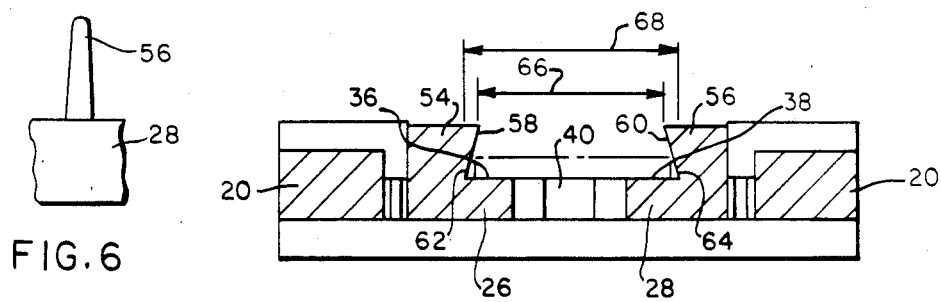
FIG. 6
FIG. 5

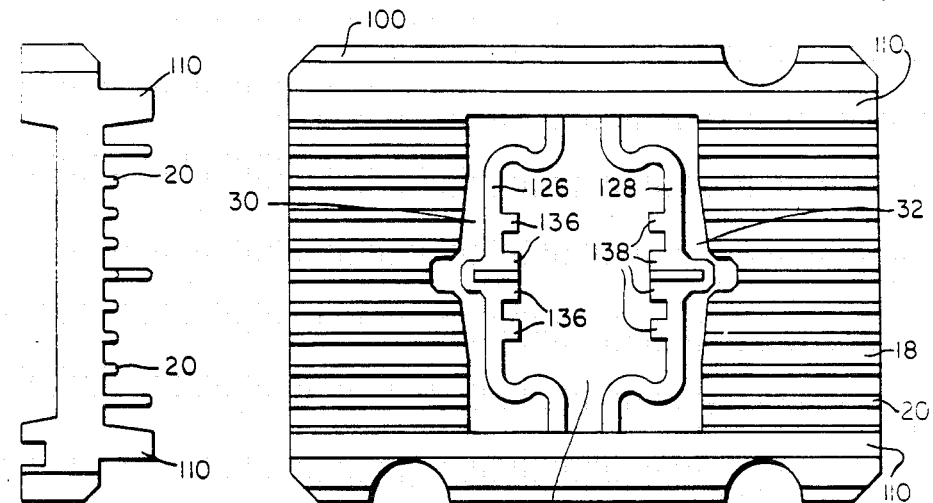
FIG. 9
FIG. 7
FIG. 8
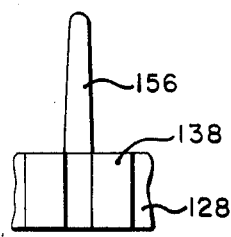
FIG. 11
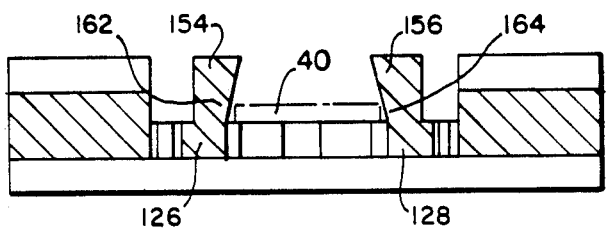
FIG. 10

INTEGRATED CIRCUIT CARRIER

This invention was made with Government support under Contract No. F-33657-81-C-0641 awarded by the Department of the Air Force. The Government has certain rights in this invention.

This invention relates generally to electronic or electrical component module carriers and more particularly to a one-piece carrier for supporting, holding and carrying standard component modules such as an integrated circuit packages (also known as flatpacks) or modularized transformers, relays and the like.

As is well known, integrated circuit packages or flatpacks, i.e., the chip structure including the electrical leads connected thereto and the housing body which covers and protects the chip structure, are relatively small in physical size and are easily damaged in handling. During the steps of fabrication, testing, marking, and general handling, it has become the practice to place such a component module in a carrier. The carrier must be able to function in a number of ways: it should protect the integrated circuit from damage during normal handling; it should permit easy loading and unloading of the component module; it should permit easy access to the leads and to the integrated circuit housing so that the integrated circuit can be readily tested and marked; it should be able to withstand the rigors of a test program; it should be reusable; and in addition, it should be economical.

Heretofore, the carriers which have been employed to hold integrated circuits have not met all of the foregoing criteria. The carriers of the prior art have in the main included two-piece carriers in which the principal piece provides a means to support the integrated circuit and to accommodate the leads which extend therefrom while the other piece is secured with the principal piece over the integrated circuit to hold the latter therein. This arrangement has been unsatisfactory for a number of reasons. By employing the two-piece carrier certain areas of the integrated circuit module cannot be readily exposed for test purposes. Moreover, the two-piece carrier is more costly to tool and inventory than is a one-piece carrier, and does not lend itself to easy loading and unloading of integrated circuit modules by automated manufacturing equipment, thereby increasing handling costs.

The prior art also includes one-piece carriers, in one of which the base sections of certain of the grooves are extended into the aperture within which the integrated circuit is disposed, and these extensions are formed to provide step-like structures which support the integrated circuit on its lower surface. This type carrier has a number of undesirable aspects in that it has been found that the extensions of the groove structure are sufficiently tenuous that any repeated use causes the step structures to become fatigued and no longer act to support the integrated circuit module with sufficient reliability. Moreover, it has been found that this type of carrier inhibits the securing of test probes in close proximity to the integrated circuit module, and further, prevents bending, cutting, forming or tinning of the leads of the integrated circuit which is so often necessary. It has been further found with respect to this last-described prior art carrier that when the carrier mounted integrated circuit is subjected to vibration or heat the integrated circuit module can be vibrated out of or released from the carrier.

One integrated circuit carrier which attempted to overcome the aforementioned disadvantages is described in U.S. Pat. No. 3,652,974. The carrier described in this patent is a one-piece carrier in which the central opening is bounded at its opposite longitudinally extending sides by the longitudinally extending side marginal portions of the carrier, and is bounded at its opposite widthwise extending sides by a pair of flexible beams spaced apart a distance just greater than the length of the body of an integrated circuit flatpack. The beams extend the width of the central opening and are anchored at their opposite ends to the carrier side marginal portions, the sides of the beams lying endwise outwardly from the central opening each defining one side of a widthwise extending slotlike beam accepting aperture into which the beams are outwardly deflected during insertion of a flatpack into the carrier, the other side of the slotlike beam accepting aperture being defined by a portion of the carrier body.

The width of the beam slots in U.S. Pat. No. 3,652,974 is such that the beams may be outwardly deflected sufficiently to permit entry of the module into the central opening, but narrow enough to limit the beam deflection during module insertion and withdrawal. Module overhang retainer projections are provided at the upper inner faces of the beams, these retainers preventing entry of a module into the central openings when the beams are not outwardly deflected and overlying the module after insertion of the latter to prevent escape. The resilient return of the beams toward their undeflected positions produces a capture of the flatpack module between the overhang retainers and the underlying support.

The carrier illustrated in U.S. Pat. No. 3,652,974 has certain disadvantages associated with it that make the use of the carrier less than optimal in a highly automated manufacturing environment. The resiliency of the beams is limited because of their parallel construction and attachment, with the result being that the carriers are unable to accept adequately a variety of different sizes of integrated circuit packages. This undesirably increases the costs associated with their use, since a large number of different sized carriers must be maintained in inventory to accommodate the variously sized flatpacks.

Additionally, because of the limited resiliency of the beams in the U.S. Pat. No. 3,652,974, the carriers described therein have a limited lifespan. The beams have a tendency to break after only a limited number of flexures, thereby destroying the ability of the carriers to carry the flatpacks. The carriers must then be disposed of, and replaced by new carriers, resulting in increased manufacturing costs.

SUMMARY OF THE INVENTION

Briefly, the aforementioned disadvantages of the prior art are overcome by the integrated circuit package carrier of the present invention which is useful to carry to variety of different sized integrated circuit packages and which is useful for a greater number of flexures. The carrier device comprises a carrier body with upper and lower surfaces and a chip body-receiving opening extending through the carrier body between the upper and lower surfaces and having spaced apart longitudinally extending and spaced apart widthwise extending bounding edges. A pair of beams are carried by the carrier body and are disposed within the body-receiving opening, with each of the beams comprising a main beam body portion and a connection spring at each end of the main beam body portion for connecting the main beam body portion to the carrier body and for biasing the main beam body portions towards each other. A beam accepting aperture is disposed longitudinally outwardly of each of the beams, and a shaped retainer projection extends upwardly from each of the beams and inwardly towards the other of the beams. The retainer projections are spaced apart at locations adjacent the beams a distance sufficient to accommodate therebetween the body of the chip to be received, while being spaced apart at their uppermost locations a distance effective to prevent passage of a chip past the retainer projections. The retainer projections, by outward deflection of the beams against the bias of the connection springs into the beam accepting apertures, are shiftable to permit passage of a chip body to between the retainer projections and being thereafter returnable to the passage preventing position when the beams return to their spring means biased positions.

BRIEF DESCRIPTION OF THE DRAWINGS

Reference is now made to the Description of the Preferred Embodiment, illustrated in the accompanying Drawings, in which:

FIG. 2 is a top plan view of the carrier;

FIG. 3 is a bottom plan view view of the carrier;

FIG. 4 is a side view of the carrier;

FIG. 5 is a cross-sectional view taken along line V—V of FIG. 2;

FIG. 6 is a cross-sectional view taken along line VI—VI of FIG. 5;

FIG. 7 is a top plan view of an alternative embodiment of the carrier illustrated in FIG. 1;

FIG. 8 is a bottom plan view view of the carrier illustrated in FIG. 7;

FIG. 9 is a side view of the carrier illustrated in FIG. 7;

FIG. 10 is a cross-sectional view taken along line X—X of FIG. 7;

FIG. 11 is a cross-sectional view taken along line XI—XI of FIG. 10;

DESCRIPTION OF THE PREFERRED EMBODIMENTS

Figure 1:
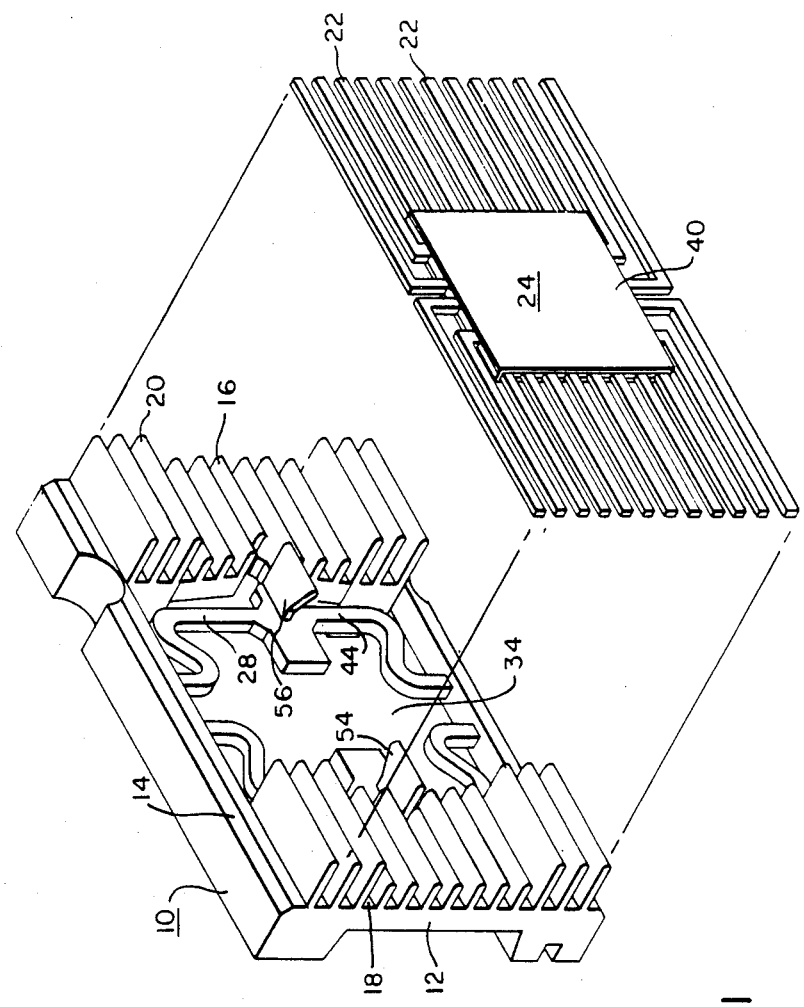
FIG. 1 is an exploded perspective view showing both a carrier in accordance with the present invention and an integrated circuit module of the flatback type.

Briefly, all of the carriers according to the invention as illustrated in the drawings, and to be hereinafter described, are generally of flat rectangular shape having a central opening within which the body of the integrated circuit module is to be disposed with the leads thereof extending longitudinally in opposite directions lengthwise of the carrier body and disposed within channels or grooves formed in the upper surface of the carrier body. The central opening is bounded at its opposite longitudinally extending sides by the longitudinally extending side marginal portions of the carrier, and is bounded at its opposite widthwise extending sides by a pair of resilient or flexible beams spaced apart a distance just greater than the length of the body of an integrated circuit flatpack. The beams extend the width of the central opening and are anchored at their opposite ends to the carrier side marginal portions, the sides of the beams lying endwise outwardly from the central opening each defining one side of a widthwise extending slotlike beam accepting aperture into which the beams are outwardly deflected during insertion of a flatpack into the carrier, the other side of the slotlike beam accepting aperture being defined by a portion of the carrier body.

The width of the beam slots is such that the beams may be outwardly deflected sufficiently to permit entry of the module into the central opening, but is narrow enough to limit the beam deflection to prevent stressing the beams beyond their elastic limit during module insertion and withdrawal. Accordingly, the side of the slotlike beam accepting aperture defined by the carrier body functions as a beam stop means. Module overhang retainer projections are provided in all embodiments at the upper inner faces of the beams, these retainers preventing entry of a module into the central openings when the beams are not outwardly deflected and overlying the module after insertion of the latter to prevent escape. An underlying module support is also provided in the form of shelves in the preferred embodiments. The resilient return of the beams toward their undeflected positions produces a completely effective capture of the flatpack module between the overhang retainers and the underlying support.

The side marginal portions of the carrier are illustrated as provided with handling notches and apertures for use with automatic handling and testing apparatus in accordance with well known techniques and will not be particularly referred to in the following descriptions. The carriers may be made of any substantially rigid material providing the necessary resilience for the beams, such as suitable thermosetting or thermoplastic plastic materials. One specific material which has been found to be particularly effective is that sold under the Tradename Victrex 3600 G.

Referring now to the drawings, and considering first FIGS. 1 to 6, there is shown a carrier 10 of the kind just described with a body 12 having longitudinally extending side marginal portions 14 and an upper surface 16 provided with a plurality of longitudinally extending channels 18 which are separated by walls 20 which channels 18 accommodate the leads 22 extending from the integrated circuit flatpack 24. Integrally formed within the carrier body 12 are widthwise extending beams 26 and 28. The carrier body 12 has formed therein slots 30,32 immediately outwardly endwise of the beams 26, 28 respectively, and a central opening 34 within which the flatpack 24 is located. Note that although illustrated as extending throughout the body 12, the central opening 34 need only extend below the level of the beams 26, 28, and the bottom of the body may be covered. However, it is preferred that the opening extend through the entire body, since numerous automated functions can be performed through the opening at the bottom.

The beams 26 and 28 are formed with flatpack supports 36, 38 which are utilized for supporting the main body portion 40 of the flatpack 24 once it is in the carrier 10, and which prevent the flatpack body 40 from being pushed through the central opening 34 as the flatpack 24 is being inserted into the carrier 10. The beams 26,28 are formed with generally parallel widthwise extending main body portions 42,44 respectively, and each body portion 42, 44 has integrally formed at each end thereof a S-shaped connection portion 46, 48, 50, and 52. The S-shaped connection portions 46, 48, 50, 52 are utilized for connecting the body portions 42, 44 to the carrier body 12 and provide the increased flexibility of the resilient beams 26, 28. In effect, the S-shaped connection members 46, 48, 50, 52 function as springs which hold the body portions 42, 44 biased towards each other but also permit the body portions to be deflected longitudinally outwardly into the slots 30, 32.

The beams 26 and 28 are provided on their upper edges with retainer projections 54, 56 spaced apart from each other in the longitudinal direction and overhanging the central opening 34. As shown in FIG. 5, the projections 54, 56 have a tapered configuration such that the distance 66 between projections 54, 56 at their top or uppermost ends 58, 60 is less than the distance 68 between projections 54, 56 at their ends 62, 64 where the projections intersect the beam main body portions 42, 44 and the supports 36, 38. The integrated circuit body 40 is slightly shorter in length, (that is, the distance measured from left to right in FIG. 1) than the distance 68 between bottom projections ends 62, 64 while being greater in length than the distance 66 between uppermost projection ends 54, 56.

To insert the flatpack 24 into the carrier 10, the beams 26 and 28 are spread or deflected into the slots 30, 32 to permit the projections 54, 56 to likewise be spread apart. The main body of the flatpack 40 is moved past the upper projection ends 58, 60 and is nestled against the supports 36, 38. The beams 26, 28 are resiliently returned to their normal undeflected positions and the flatpack main body 40 is held longitudinally by the projections 54, 56, as shown in dotted lines in FIG. 5. This arrangement keeps the integrated circuit 24 from falling out of the carrier 10 in the event that the carrier 10 should be turned upside down or in any way joggled, vibrated or subjected to impacts such as due to shipping, loading from vibratory feeders and the like.

As was noted previously, the S-shaped connection portions provide for increased flexibility of the resilient beams 26, 28. Because of this increased flexibility, the number of sizes of flatpacks 24 which can be held between the projections 54, 56 has been increased substantially. Instead of requiring an inventory of greater than thirty different sized carriers to accommodate the variety of different-sized flatpacks, the same functionability can be provided with less than ten variously-sized carriers 10 of the present invention. Furthermore, instead of having a life expectancy of less than twenty flexures, carriers constructed as described with the improved S-shaped connection portions have a life expectancy of greater than one hundred flexures. Thus, the carrier of this invention provides economic advantages not only because of its increased usage rate, but also because of the reduced inventory carrying costs.

FIG. 7 is a top plan view of a second embodiment of the present invention, the other views of which are seen in FIGS. 8 to 11. The beams 126 and 128, together with slots 30 and 32 and central opening 34 are formed and disposed in the same manner as previously described in connection with the embodiment of FIGS. 1 to 6. In this embodiment, however, instead of having only one support 36, 38 extending from each beam 126, 128, there are are plurality of supports 136, 138. The additional supports 136, 138 may be desirable or required for larger sizes of flatpacks 24, or for flatpacks 24 with greater numbers of leads 22. Additionally, the widthwise outermost walls 110 are of increased dimension to provide better protection and handling of the flatpacks and carriers.

FIG. 10 shows that in this alternative embodiment, it may be desirable to provide a flat section 162, 164 on the overhanging projections 154, 156 which hold the flatpack body 40 in the carrier 100. These flat sections 162, 164, located at the point where the projections 154, 156 intersect the beams 126, 128, can be utilized to provide for better nesting and a larger contact area when the flatpack body 40 is inserted between the projections 154, 156.

Figure 12:
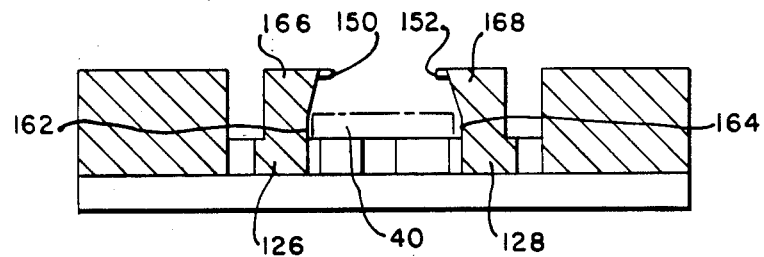
FIG. 12 is a cross-sectional view similar to FIGS. 5 and 10 illustrating an alternative embodiment of the retainer projections.
Figure 13:
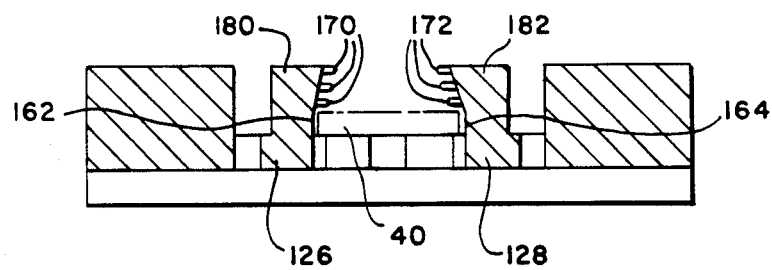
FIG. 13 is a cross-sectional view similar to FIGS. 5 and 10 illustrating another alternative embodiment of the retainer projections.

Other alternative embodiments for the design of the retainer projections are illustrated in FIGS. 12 and 13. In FIG. 12, it can be seen that gripper members 150, 152 extend longitudinally from the projection retainers 166, 168 towards each other. These gripper members 150, 152 can provide for increased reliability in that they ensure that the flatpack will be retained between the projections. FIG. 13 illustrates that there may be a plurality of gripper members 170, 172 extending from the retainer projections 180, 182, which not only increase the reliability but also may be useful for holding flatpacks of varying height.

Thus, it can be readily appreciated that what has been described is an improved carrier for electronic integrated circuit packages. The carrier is a unique device for holding, centering, carrying and protecting flatpacks, with a capability for easy removal and insertion of flatpack components without damage. Its self-centering mechanical grip design and shelf support gives the carrier strength yet allows access for fabrication steps. Its retainer projection design allows for wide tolerances in parts to be held, thus simplifying the tooling requirements when several parts of different measurements are being used.

What is claimed is:

1. A carrier device for holding an electronic component module of the type having leads extending therefrom, comprising:

a carrier body having upper and lower surfaces and a module body-receiving opening extending through said carrier body between said upper and lower surfaces and having spaced apart longitudinally extending and spaced apart widthwise extending bounding edges;

a pair of resilient beams carried by said carrier body and disposed within said module body-receiving opening, each of said beams comprising a main beam body portion and a S-shaped connection member at each end of said main beam body portion connecting said main beam body portion to said carrier body;

a beam accepting aperture disposed longitudinally outwardly of each of said beams; and a tapered retainer projection extending upwardly from each of said beams and inwardly towards the other of said beams, said retainer projections being spaced apart at locations adjacent said beams a distance sufficient to accommodate therebetween the body of the module to be received in said body-receiving opening, said retainer projections being spaced apart at their uppermost locations a distance effective to prevent passage of a module past said retainer projections, said retainer projections by outward deflection of said beams into said beam accepting apertures being shiftable to permit passage of a module body to between said retainer projections and being thereafter returnable to the passage preventing position when said beams resiliently return to their undeflected positions.

2. The device according to claim 1 including a module support extending inwardly from each of said beams towards the other of said beams and wherein the body of the module to be carried by said device is supported by said module supports between said retainer projections.

3. The device according to claim 2 including a plurality of widthwise spaced module supports extending inwardly from each of said beams towards the other of said beams.

4. The device according to claim 1 wherein each of said tapered retainer projections includes a non-tapered flat portion thereof adjacent the location where said projection intersects said beam, said module body being held by the flat portions of said projections.

5. The device according to claim 4 including a module support extending inwardly from each of said beams towards the other of said beams and wherein the body of the module to be carried by said device is supported by said module supports between said retainer projections flat portions.

6. The device according to claim 5 including a plurality of widthwise spaced module supports extending inwardly from each of said beams towards the other of said beams.

7. The device according to claim 1 including a gripper member extending inwardly from each of said retainer projections towards the other of said retainer projections.

8. The device according to claim 7 wherein said gripper members are disposed at the uppermost ends of said retainer projections.

9. The device according to claim 7 including a plurality of gripper members extending inwardly from each of said retainer projections towards the other of said retainer projections.

10. A carrier device for holding an electronic component module of the type having leads extending therefrom, comprising:
a carrier body having upper and lower surfaces and a module body-receiving opening extending through said carrier body between said upper and lower surfaces and having spaced apart longitudinally extending and spaced apart widthwise extending bounding edges;
a pair of beams carried by said carrier body and disposed within said module body-receiving opening, each of said beams including a linear main beam body portion having a pair of opposing end portions extending therefrom and positioned transverse to a longitudinal axis of said carrier body;
each of said beams further including non-linear resilient means connected between each said linear body end portion and an adjacent longitudinally extending bounding edge for connecting said linear main beam body portion to said carrier body and biasing said linear main beams body portions towards each other;
a beam accepting aperture disposed longitudinally outwardly of each of said beams; and
a shaped retainer projection extending upwardly from each of said linear main beam body portions and inwardly towards the other of said beams, said retainer projections being spaced apart at locations adjacent said beams a distance sufficient to accommodate therebetween the body of the module to be received in said body-receiving opening, said retainer projections being spaced apart at their uppermost locations a distance effective to prevent passage of a module past said retainer projections, said retainer projections by outward deflection of said linear main beams body portions against the bias of said non-linear resilient means into said beam accepting apertures being shiftable to permit passage of a module body between said retainer projections and being thereafter returnable to the passage preventing position as said linear main beams body portions return to their resilient means biased positions.

11. The device according to claim 10 including a module support extending inwardly from each of said beams towards the other of said beams and wherein the body of the module to be carried by said device is supported by said module supports between said retainer projections.

12. The device according to claim 11 including a plurality of widthwise spaced module supports extending inwardly from each of said beams towards the other of said beams.

13. The device according to claim 10 wherein each of said shaped retainer projections includes a flat portion thereof adjacent the location where said projection intersects said beam, said module body being held by the flat portions of said projections.

14. The device according to claim 13 including a module support extending inwardly from each of said beams towards the other of said beams and wherein the body of the module to be carried by said device is supported by said module supports between said retainer projections flat portions.

15. The device according to claim 14 including a plurality of widthwise spaced module supports extending inwardly from each of said beams towards the other of said beams.

16. The device according to claim 10 including a gripper member extending inwardly from each of said retainer projections towards the other of said retainer projections.

17. The device according to claim 16 wherein said gripper members are disposed at the uppermost ends of said retainer projections.

18. The device according to claim 16 including a plurality of gripper members extending inwardly from each of said retainer projections towards the other of said retainer projections.

19. The device according to claim 10 wherein said resilient means comprises a S-shaped connection member.

20. The device according to claim 19 wherein said S-shaped connection member is integrally formed with said linear main beam body portion.

21. In a one piece flatpack chip carrier having a body portion with a central aperture therethrough and having mounted thereon opposed channels extending longitudinally from said central aperture for retaining a flatpack chip's leads extending from a flatpack chip's body, and means for releasably retaining a flatpack chip's body in said central aperture, an improved flatpack chip carrier in which said means for releasably retaining said flatpack chip body in said central aperture comprises:
a pair of spaced apart beams positioned within said central aperture, each of said beams including a linear main beam body portion having a pair of opposing end portions extending therefrom and positioned transverse to a longitudinal axis of said carrier body;

each of said beams further including non-linear resilient means extending between each said linear main beam body end portion and said carrier body with a connecting end portion of said resilient means secured to said carrier body for movably connecting said linear main beams body portions to said carrier body and biasing said linear main beams body portions towards each other;

said pair of linear main beam body portions being separated from each other by a distance greater than a distance between the connecting end portions of longitudinally adjacent non-linear resilient means;

a beam accepting aperture disposed longitudinally outwardly of each of said beams; and a shaped retainer projection extending upwardly from each of said linear main beams body portions and inwardly towards the other of said main beams body portions, said retainer projections being spaced apart at locations adjacent said main beams body portions a distance sufficient to accommodate therebetween the body of a flatpack chip to be received in said central aperture, said retainer projections being spaced apart at their uppermost locations a distance effective to prevent passage of a flatpack chip body past said retainer projections, said retainer projections by outward deflection of said main beams body portions against the bias of said resilient means into said beam accepting apertures being shiftable to permit passage of a chip body between said retainer projections and being thereafter returnable to a passage preventing position as said main beams body portions are returned to their resilient means biased positions.

22. The device according to claim 21 including a chip support extending inwardly from each of said beams main body portions towards the other of said beams and wherein the body of the chip to be carried by said device is supported by said chip supports between said retainer projections.

23. The device according to claim 22 including a plurality of widthwise spaced chip supports extending inwardly from each of said beams main body portions towards the other of said beams.

24. The device according to claim 21 wherein each of said shaped retainer projections includes a flat portion thereof adjacent the location where said projection intersects said beam main body portion, said chip body being held by the flat portions of said projections.

25. The device according to claim 24 including a chip support extending inwardly from each of said beams main body portion towards the other of said beams and wherein the body of the chip to be carried by said device is supported by said chip supports between said retainer projections flat portions.

26. The device according to claim 21 including a gripper member extending inwardly from each of said retainer projections towards the other of said retainer projections.

27. The device according to claim 26 wherein said gripper members are disposed at the uppermost ends of said retainer projections.

28. The device according to claim 27 including a plurality of gripper members extending inwardly from each of said retainer projections towards the other of said retainer projections.

29. The device according to claim 21 wherein said resilient means comprises a S-shaped connection member.

30. The device according to claim 29 wherein said S-shaped connection member is integrally formed with said linear main body portion.

* * * * *